United States Patent
Nodera et al.

(10) Patent No.: US 7,993,705 B2
(45) Date of Patent: Aug. 9, 2011

(54) FILM FORMATION APPARATUS AND METHOD FOR USING THE SAME

(75) Inventors: Nobutake Nodera, Nirasaki (JP); Kazuhide Hasebe, Nirasaki (JP); Kazuya Yamamoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 722 days.

(21) Appl. No.: 11/819,500

(22) Filed: Jun. 27, 2007

(65) Prior Publication Data
US 2008/0003362 A1 Jan. 3, 2008

(30) Foreign Application Priority Data

Jun. 29, 2006 (JP) .................................. 2006-180506

(51) Int. Cl.
*C23C 16/56* (2006.01)
*C23C 16/00* (2006.01)
*C23C 16/54* (2006.01)
*B08B 7/00* (2006.01)
*B08B 7/04* (2006.01)

(52) U.S. Cl. ..................... 427/255.394; 134/18; 134/26; 134/30; 134/22.18; 156/345.37; 156/345.52; 156/345.53; 118/723 R; 118/724; 118/70; 438/905

(58) Field of Classification Search .................... 134/26, 134/30, 31, 22.17, 22.18, 18; 438/905; 118/715, 118/723 R, 724, 615, 70, 725; 156/345.35, 156/345.37, 345.52, 345.53; 427/255.394
See application file for complete search history.

(56) References Cited

U.S. PATENT DOCUMENTS

| | | | |
|---|---|---|---|
| 6,573,178 B1 | 6/2003 | Nakamura | |
| 6,905,549 B2 * | 6/2005 | Okuda et al. | 118/715 |
| 7,094,708 B2 | 8/2006 | Kato et al. | |
| 2005/0255712 A1 * | 11/2005 | Kato et al. | 438/791 |
| 2006/0141782 A1 * | 6/2006 | Hasebe et al. | 438/680 |

FOREIGN PATENT DOCUMENTS

KR     2006065513 A  *  6/2006

OTHER PUBLICATIONS

Chinese Office Action mailed on Mar. 3, 2010 for Chinese Application No. 200710126883.0 w/partial English translation.

* cited by examiner

*Primary Examiner* — Alexander Markoff
(74) *Attorney, Agent, or Firm* — Smith, Gambrell & Russell, LLP

(57) ABSTRACT

A method for using a film formation apparatus includes performing film formation of a product film selected from the group consisting of a silicon nitride film and a silicon oxynitride film on a target substrate within a reaction chamber of the film formation apparatus; and unloading the target substrate from the reaction chamber. Thereafter, the method includes first heating an inner surface of the reaction chamber at a post process temperature while supplying a post process gas for nitridation into the reaction chamber, thereby performing nitridation of a by-product film deposited on the inner surface of the reaction chamber; then rapidly cooling the inner surface of the reaction chamber, thereby cracking the by-product film by a thermal stress; and then forcibly exhausting gas from inside the reaction chamber to carry the by-product film, thus peeled off from the inner surface.

14 Claims, 7 Drawing Sheets

US 7,993,705 B2

FILM FORMATION APPARATUS AND METHOD FOR USING THE SAME

BACKGROUND OF THE INVENTION

1. Field of the Invention

The present invention relates to a film formation apparatus for a semiconductor process for forming a film on a target substrate, such as a semiconductor wafer, and also to a method for using the apparatus. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In the process of manufacturing semiconductor devices, a process is performed for forming a silicon nitride film on the surface of a target substrate, such as a semiconductor wafer (which will be also simply referred to as "wafer" hereinafter). Silicon nitride films are widely used, because they have better insulation properties as compared to silicon oxide films, and they can sufficiently serve as etching stopper films or inter-level insulating films. For example, a silicon nitride film is formed by CVD (Chemical Vapor Deposition) using a reaction between a silane family gas, such as dichlorosilane ($SiH_2Cl_2$: DCS), and ammonia ($NH_3$) gas.

In a heat processing apparatus, as a process for forming a silicon nitride film is repeatedly performed, by-product films are deposited and gradually accumulated on the inner surface of the process container (reaction chamber) and wafer holder. The by-product films thus formed are partly peeled off and generate particles when the interior of the process container is heated for a subsequent heat process after the cumulative film thickness reaches a predetermined thickness. The particles may drop on semiconductor wafers, and reduce the yield of semiconductor devices to be fabricated. Further, the by-product films may emit gases, which cause a reaction and thereby deposit unexpected components on wafers.

U.S. Pat. No. 6,573,178 B1 discloses a technique for dealing with the problem described above. According to this technique, when the cumulative film thickness of a film formation process reaches a predetermined thickness, a purge process is performed after processed wafers W are unloaded from the process container and before subsequent unprocessed wafers W are loaded into the process container. For example, where the target film thickness of a film formation process performed once is larger than the predetermined thickness, the purge process accompanies the film formation process every time. According to this purge process, while an inactive gas, such as nitrogen gas, is supplied into the process container, the interior of the process container is cooled from the film formation temperature. This is intended to positively apply a thermal stress to by-product films inside the process container to crack the films and thereby positively peel off and remove surface portions of the films. The film portions removed by this purge process are surface portions of the films deposited inside the process container in a sate where they can easily become particles. However, where these portions are removed, generation of gases and/or particles is suppressed in the film formation process performed subsequently to the purge process.

In recent years, owing to the demands of increased miniaturization and integration of semiconductor integrated circuits, it is required to alleviate the thermal history of semiconductor devices in manufacturing steps, thereby improving the characteristics of the devices. For vertical processing apparatuses, it is also required to improve semiconductor processing methods in accordance with the demands described above.

U.S. Pat. No. 7,094,708 B2 discloses a structure of a vertical processing apparatus for performing a molecular layer deposition method, which utilizes plasma assistance to further decrease the process temperature. According to this apparatus, for example, where dichlorosilane (DCS) and $NH_3$ are used as a silane family gas and a nitriding gas, respectively, to form a silicon nitride film (SiN), the process is performed, as follows. Specifically, DCS and $NH_3$ gas are alternately and intermittently supplied into a process container with purge periods interposed therebetween. When $NH_3$ gas is supplied, an RF (radio frequency) is applied to generate plasma so as to promote a nitridation reaction. More specifically, when DCS is supplied into the process container, a layer with a thickness of one molecule or more of DCS is adsorbed onto the surface of wafers. The superfluous DCS is removed during the purge period. Then, $NH_3$ is supplied and plasma is generated, thereby performing low temperature nitridation to form a silicon nitride film. These sequential steps are repeated to complete a film having a predetermined thickness.

BRIEF SUMMARY OF THE INVENTION

An object of the present invention is to provide a film formation apparatus for a semiconductor process and a method for using the same, which can suppress particle contamination during a film formation process of a silicon nitride film or silicon oxynitride film.

According to a first aspect of the present invention, there is provided a method for using a film formation apparatus, the method comprising:

performing film formation of a product film selected from the group consisting of a silicon nitride film and a silicon oxynitride film on a target substrate within a reaction chamber of the film formation apparatus;

unloading the target substrate from the reaction chamber;

then, heating an inner surface of the reaction chamber at a post process temperature while supplying a post process gas for nitridation into the reaction chamber, thereby performing nitridation of a by-product film deposited on the inner surface of the reaction chamber;

rapidly cooling the inner surface of the reaction chamber from the post process temperature after the nitridation, thereby cracking the by-product film by a thermal stress and peeling off the by-product film from the inner surface of the reaction chamber; and forcibly exhausting gas from inside the reaction chamber to carry the by-product film, thus peeled off from the inner surface, by a gas flow, thereby exhausting the by-product film from the reaction chamber.

According to a second aspect of the present invention, there is provided a film formation apparatus for performing film formation of a product film selected from the group consisting of a silicon nitride film and a silicon oxynitride film on a target substrate, the apparatus comprising:

a reaction chamber configured to accommodate the target substrate;

a transfer mechanism configured to load and unload the target substrate to and from the reaction chamber;

a heater configured to heat an interior of the reaction chamber;

an exhaust system configured to exhaust gas from inside the reaction chamber;

a film formation gas supply circuit configured to supply a film formation gas for forming the product film into the reaction chamber;

a post process gas supply circuit configured to supply a post process gas for nitridation of a by-product film, deposited on an inner surface of the reaction chamber, into the reaction chamber; and a control section configured to control an operation of the apparatus, wherein the control section executes performing film formation of the product film on a target substrate within the reaction chamber, unloading the target substrate from the reaction chamber, then, heating the inner surface of the reaction chamber at a post process temperature while supplying the post process gas into the reaction chamber, thereby performing nitridation of a by-product film deposited on the inner surface of the reaction chamber, rapidly cooling the inner surface of the reaction chamber from the post process temperature after the nitridation, thereby cracking the by-product film by a thermal stress and peeling off the by-product film from the inner surface of the reaction chamber, and forcibly exhausting gas from inside the reaction chamber to carry the by-product film, thus peeled off from the inner surface, by a gas flow, thereby exhausting the by-product film from the reaction chamber.

According to a third aspect of the present invention, there is provided a computer readable storage medium containing program instructions for execution on a processor, wherein the program instructions, when executed by the processor, cause the film formation apparatus to execute performing film formation of a product film selected from the group consisting of a silicon nitride film and a silicon oxynitride film on a target substrate within a reaction chamber of the film formation apparatus;

unloading the target substrate from the reaction chamber;

then, heating an inner surface of the reaction chamber at a post process temperature while supplying a post process gas for nitridation into the reaction chamber, thereby performing nitridation of a by-product film deposited on the inner surface of the reaction chamber;

rapidly cooling the inner surface of the reaction chamber from the post process temperature after the nitridation, thereby cracking the by-product film by a thermal stress and peeling off the by-product film from the inner surface of the reaction chamber; and forcibly exhausting gas from inside the reaction chamber to carry the by-product film, thus peeled off from the inner surface, by a gas flow, thereby exhausting the by-product film from the reaction chamber.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
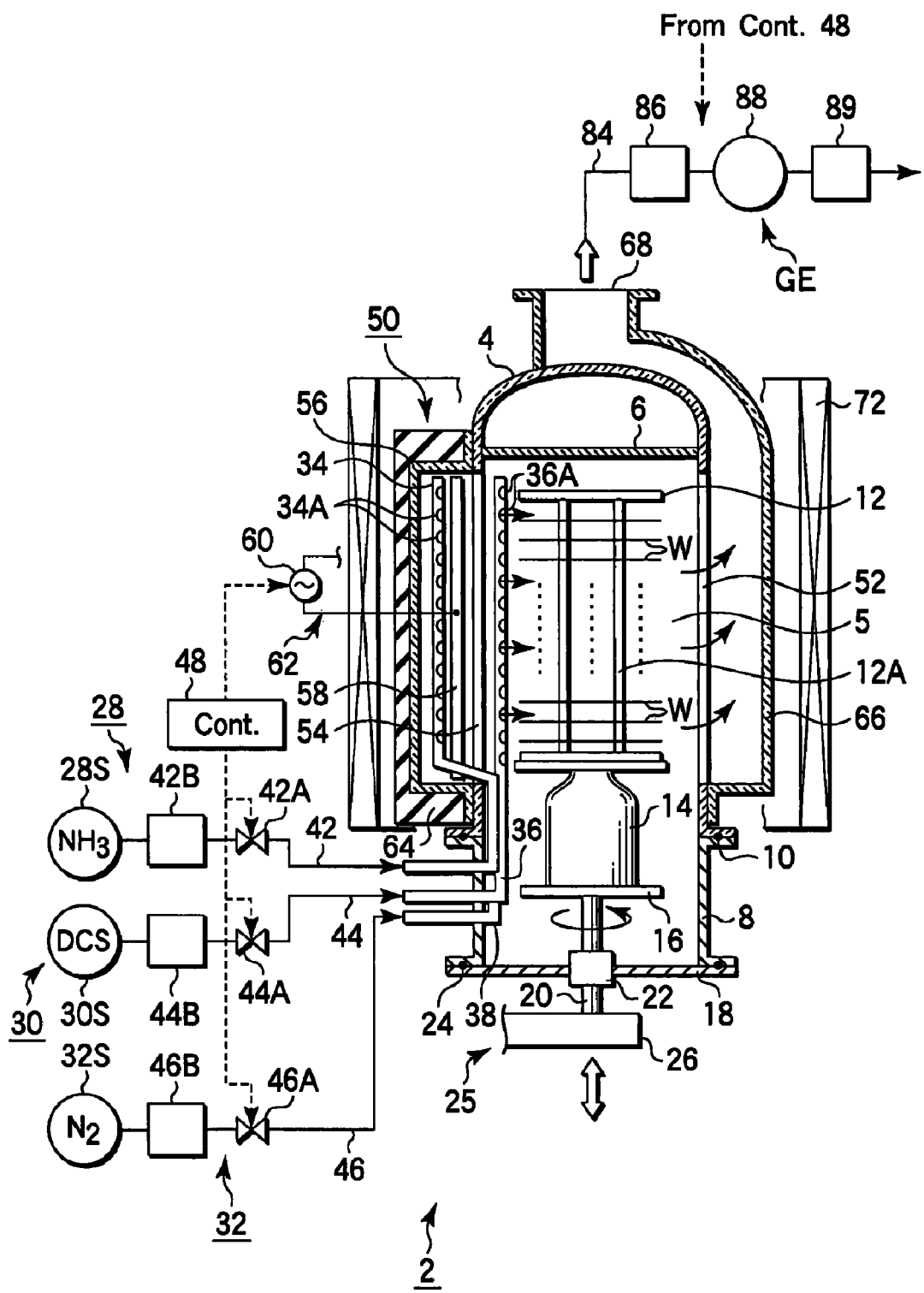
FIG. 1 is a sectional view showing a vertical plasma processing apparatus (vertical plasma film formation apparatus) according to an embodiment of the present invention.

In the process of developing the present invention, the inventors studied problems caused in the techniques disclosed in Patent Documents 1 and 2 described above. As a result, the inventors have arrived at the findings given below.

Specifically, where the purge process of Patent Document 1 arranged to cool the interior of the process container was applied to the film formation method of Patent Document 2 utilizing plasma assistance, an expected decrease in the number of particles was not attained in the film formation process. By studying this problem, it has been found that the main cause resides in that a certain condition within the process container is less uniform due to a factor peculiar to the film formation method utilizing plasma assistance. Specifically, since the activation level of ammonia ($NH_3$) is optimized for a process field in which wafers are placed, radicals have been deactivated or decreased at some areas around the process field, such as a position near the exhaust port of the process container. In such areas, the reaction of ammonia with silicon is low, and thus by-product films, which contain silicon nitride as the main component (it means 50% or more), deposited in the process container are silicon rich films having a lower content of nitrogen and a higher content of silicon. These films can be hardly peeled off by the purge process arranged to cool the interior of the process container. Consequently, the number of particles deposited on wafers is not decreased in the film formation process performed subsequently to the purge process.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 2:
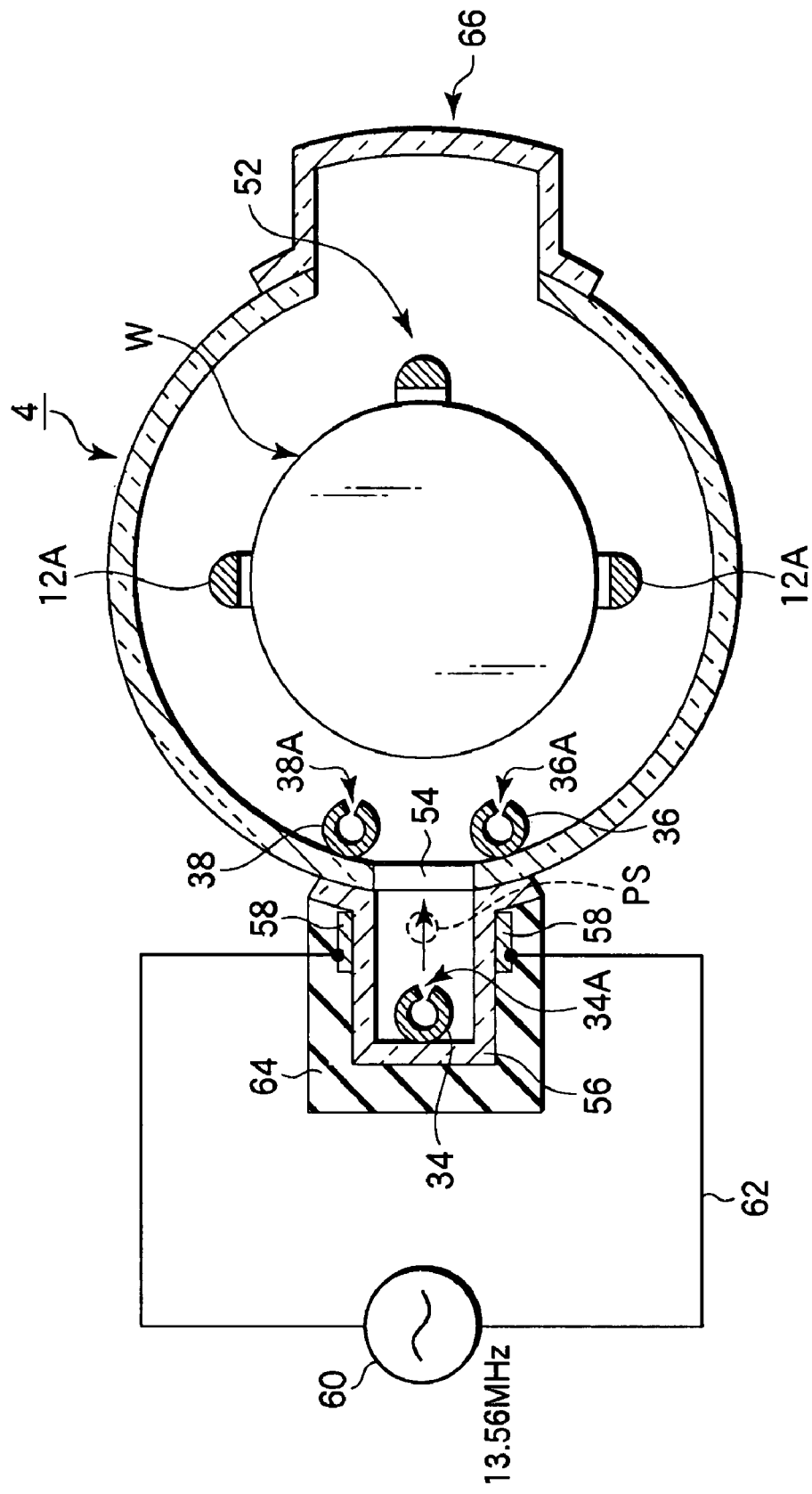
FIG. 2 is a sectional plan view showing part of the apparatus shown in FIG. 1.
Figure 3:
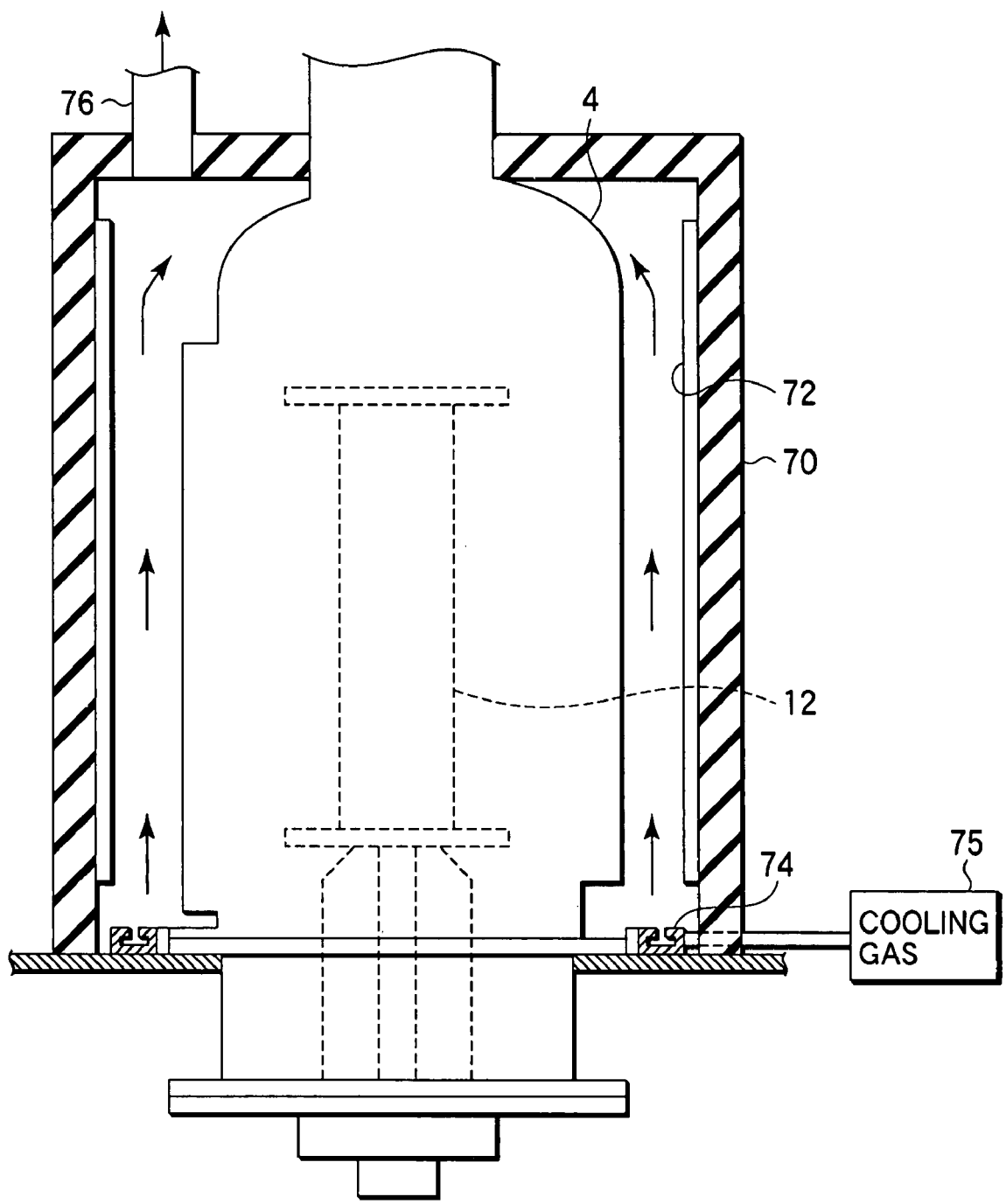
FIG. 3 is a sectional view schematically showing the relationship between a process container and a casing that covers the container, in the apparatus shown in FIG. 1.

FIG. 1 is a sectional view showing a vertical plasma processing apparatus (vertical plasma film formation apparatus) according to an embodiment of the present invention. FIG. 2 is a sectional plan view showing part of the apparatus shown in FIG. 1. FIG. 3 is a sectional view schematically showing the relationship between a process container and a casing that covers the container, in the apparatus shown in FIG. 1. The film formation apparatus 2 has a process field configured to be selectively supplied with a first process gas containing dichlorosilane (DCS) gas as a silane family gas, a second process gas containing ammonia (NH$_3$) gas as a nitriding gas, and an assist gas comprising an inactive gas, such as N$_2$ gas. The film formation apparatus 2 is configured to form a silicon nitride film on target substrates by CVD in the process field.

The apparatus 2 includes a process container (reaction chamber) 4 shaped as a cylindrical column with a ceiling and an opened bottom, in which a process field 5 is defined to accommodate and process a plurality of semiconductor wafers (target substrates) stacked at intervals. The entirety of the process container 4 is made of, e.g., quartz. The top of the process container 4 is provided with a quartz ceiling plate 6 to airtightly seal the top. The bottom of the process container 4 is connected through a seal member 10, such as an O-ring, to a cylindrical manifold 8. The process container may be entirely formed of a cylindrical quartz column without a manifold 8 separately formed.

The cylindrical manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. A number of target substrates or semiconductor wafers W are stacked on a wafer boat 12. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the manifold 8.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down in unison. The table 16 may be fixed to the lid 18, so that wafers W are processed without rotation of the wafer boat 12.

A gas supply section is connected to the side of the manifold 8 to supply predetermined process gases to the process field 5 within the process container 4. Specifically, the gas supply section includes a second process gas supply circuit 28, a first process gas supply circuit 30, and an assist gas supply circuit 32. The first process gas supply circuit 30 is arranged to supply a first process gas containing a silane family gas, such as DCS (dichlorosilane: SiH$_2$Cl$_2$) gas. The second process gas supply circuit 28 is arranged to supply a second process gas containing a nitriding gas, such as ammonia (NH$_3$) gas. The assist gas supply circuit 32 is arranged to supply an inactive gas, such as N$_2$ gas, as a purge gas or an assist gas for adjusting pressure. Each of the first and second process gases may be mixed with a suitable amount of carrier gas (such as N$_2$ gas), as needed. However, such a carrier gas will not be mentioned, hereinafter, for the sake of simplicity of explanation.

More specifically, the second process gas supply circuit 28, first process gas supply circuit 30, and assist gas supply circuit 32 include gas distribution nozzles 34, 36, and 38, respectively, each of which is formed of a quartz pipe which penetrates the sidewall of the manifold 8 from the outside and then turns and extends upward (see FIG. 2). The gas distribution nozzles 34, 36, and 38 respectively have a plurality of gas spouting holes 34A, 36A, and 38A, each set being formed at predetermined intervals in the longitudinal direction (the vertical direction) over all the wafers W on the wafer boat 12.

The nozzles 34, 36, and 38 are connected to gas sources 28S, 30S, and 32S of NH$_3$ gas, DCS gas, and N$_2$ gas, respectively, through gas supply lines (gas passages) 42, 44, and 46, respectively. The gas supply lines 42, 44, and 46 are provided with switching valves 42A, 44A, and 46A and flow rate controllers 42B, 44B, and 46B, such as mass flow controllers, respectively. With this arrangement, NH$_3$ gas, DCS gas, and N$_2$ gas can be supplied at controlled flow rates.

A gas exciting section 50 is formed at the sidewall of the process container 4 in the vertical direction. On the side of the process container 4 opposite to the gas exciting section 50, a long and thin exhaust port 52 for vacuum-exhausting the inner atmosphere is formed by cutting the sidewall of the process container 4 in, e.g., the vertical direction.

Specifically, the gas exciting section 50 has a vertically long and thin opening 54 formed by cutting a predetermined width of the sidewall of the process container 4, in the vertical direction. The opening 54 is covered with a quartz cover 56 airtightly connected to the outer surface of the process container 4. The cover 56 has a vertically long and thin shape with a concave cross-section, so that it projects outward from the process container 4.

With this arrangement, the gas exciting section 50 is formed such that it projects outward from the sidewall of the process container 4 and is connected on the other side to the interior of the process container 4. In other words, the inner space of the gas exciting section 50 communicates through the opening 54 with the process field 5 within the process container 4. The opening 54 has a vertical length sufficient to cover all the wafers W on the wafer boat 12 in the vertical direction.

A pair of long and thin electrodes 58 are disposed on the opposite outer surfaces of the cover 56, and face each other while extending in the longitudinal direction (the vertical direction). The electrodes 58 are connected to an RE (Radio Frequency) power supply 60 for plasma generation, through feed lines 62. An RF voltage of, e.g., 13.56 MHz is applied to the electrodes 58 to form an RE electric field for exciting plasma between the electrodes 58. The frequency of the RF voltage is not limited to 13.56 MHz, and it may be set at another frequency, e.g., 400 kHz.

The gas distribution nozzle 34 of the second process gas is bent outward in the radial direction of the process container 4 at a position lower than the lowermost wafer W on the wafer boat 12. Then, the gas distribution nozzle 34 vertically extends at the deepest position (the farthest position from the center of the process container 4) in the gas exciting section 50. As also shown in FIG. 2, the gas distribution nozzle 34 is separated outward from an area sandwiched between the pair of electrodes 58 (a position where the RF electric field is most intense), i.e., a plasma generation area PS where the main plasma is actually generated. The second process gas containing NH$_3$ gas is spouted from the gas spouting holes 34A of the gas distribution nozzle 34 toward the plasma generation area PS. Then, the second process gas is excited (decomposed or activated) in the plasma generation area PS, and is supplied in this state through the opening 54 onto the wafers W on the wafer boat 12.

An insulating protection cover 64 made of, e.g., quartz is attached to and covers the outer surface of the cover 56. A cooling mechanism (not shown) is disposed in the insulating protection cover 64 and comprises coolant passages respectively facing the electrodes 58. The coolant passages are supplied with a coolant, such as cooled nitrogen gas, to cool the electrodes 58. The insulating protection cover 64 is covered with a shield (not shown) disposed on the outer surface to prevent RF leakage.

The gas distribution nozzles 36 and 38 of the first process gas and assist gas extend upward and face each other at positions near and outside the opening 54 of the gas exciting section 50, i.e., on both sides of the outside of the opening 54 (in the process container 4). The first process gas containing DCS gas and the assist gas consisting of $N_2$ gas are spouted from the gas spouting holes 36A and 38A of the gas distribution nozzles 36 and 38, respectively, toward the center of the process container 4. The gas spouting holes 36A and 38A are formed at positions between the wafers W on the wafer boat 12 to respectively deliver the first process gas (containing DCS) and assist gas ($N_2$ gas) essentially uniformly in the horizontal direction, so as to form gas flows parallel with the wafers W.

On the other hand, the exhaust port 52, which is formed opposite the gas exciting section 50, is covered with an exhaust port cover member 66. The exhaust port cover member 66 is made of quartz with a U-shape cross-section, and attached by welding. The exhaust port cover member 66 extends upward along the sidewall of the process container 4, and has a gas outlet 68 at the top of the process container 4. The gas outlet 68 is connected to a vacuum-exhaust system GE including a vacuum pump and so forth. The vacuum exhaust system GE has an exhaust passage 84 connected to the gas outlet 68, on which a valve unit (an opening degree adjustment valve) 86, a vacuum pump 88, and a detoxification unit 89 for removing undesirable substances are disposed in this order from the upstream side.

As shown in FIG. 3, the process container 4 is essentially airtightly surrounded by a casing 70. The casing 70 is provided with a heater 72 on the inner surface for heating the atmosphere and wafers W inside the process container 4. For example, the heater 72 is formed of a carbon wire, which causes no contamination and has good characteristics for increasing and decreasing the temperature. A thermocouple (not shown) is disposed near the exhaust port 52 in the process container 4 to control the heater 72. An annular gas supply port 74 is disposed on the bottom of the casing 70 and is connected to a cooling gas supply source 75. A cooling gas exhaust passage 76 is connected to the top of the casing 70.

The film formation apparatus 2 further includes a main control section 48 formed of, e.g., a computer, to control the entire apparatus. The main control section 48 can control the film formation process described below in accordance with the process recipe of the film formation process concerning, e.g., the film thickness and composition of a film to be formed, stored in the memory thereof in advance. In the memory, the relationship between the process gas flow rates and the thickness and composition of the film is also stored as control data in advance. Accordingly, the main control section 48 can control the elevating mechanism 25, gas supply circuits 28, 30, and 32, exhaust system GE (including the valve unit 86), gas exciting section 50, heater 72, and so forth, based on the stored process recipe and control data.

Figure 7:
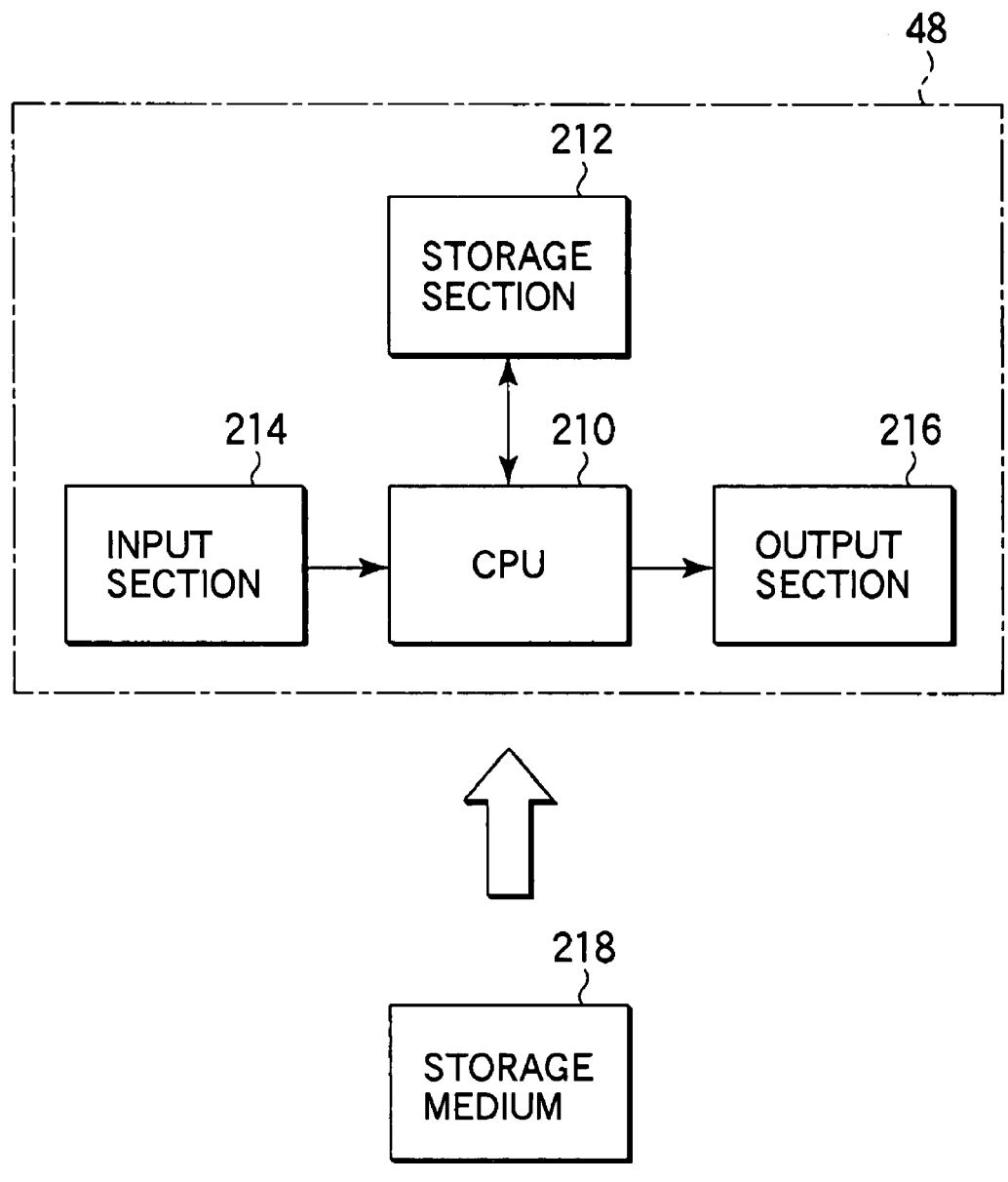
FIG. 7 is a block diagram schematically showing the structure of a main control section used in the apparatus shown in FIG. 1.

FIG. 7 is a block diagram schematically showing the structure of the main control section 48 of the apparatus shown in FIG. 1. The main control section 48 includes a CPU 210, which is connected to a storage section 212, an input section 214, and an output section 216. The storage section 212 stores process programs and process recipes. The input section 214 includes input devices, such as a keyboard, a pointing device, and a storage media drive, to interact with an operator. The output section 216 outputs control signals for controlling components of the processing apparatus. FIG. 7 also shows a storage medium 218 attached to the computer in a removable state.

The film formation method described below may be written as program instructions for execution on a processor, into a computer readable storage medium or media to be applied to a semiconductor processing apparatus. Alternately, program instructions of this kind may be transmitted by a communication medium or media and thereby applied to a semiconductor processing apparatus. Examples of the storage medium or media are a magnetic disk (flexible disk, hard disk (a representative of which is a hard disk included in the storage section 212), etc.), an optical disk (CD, DVD, etc.), a magneto-optical disk (MO, etc.), and a semiconductor memory. A computer for controlling the operation of the semiconductor processing apparatus reads program instructions stored in the storage medium or media, and executes them on a processor, thereby performing a corresponding method, as described below.

Next, an explanation will be given of a film formation method (so called MLD (Molecular Layer Deposition) film formation) performed in the apparatus shown in FIG. 1. In summary, this film formation method is arranged to alternately supply a first process gas containing dichlorosilane (DCS) gas as a silane family gas and a second process gas containing ammonia ($NH_3$) gas as a nitriding gas to the process field 5 accommodating wafers W to form a silicon nitride film on the wafers W by CVD. At this time, the process pressure (the pressure of the process field 5) is set to be within a range of 0.2 to 1 Torr (27 to 133 Pa (1 Torr=133.3 Pa)). The process temperature is lower than that for ordinary CVD processes, and is set to be within a range of 250 to 700° C.

At first, the wafer boat 12 at room temperature, which supports a number of, e.g., 50 to 100, wafers having a diameter of 300 mm, is loaded into the process container 4 heated at a predetermined temperature. Then, the interior of the process container 4 is vacuum-exhausted and kept at a predetermined process pressure, and the wafer temperature is increased to a process temperature for film formation, such as 630° C. At this time, the apparatus is in a waiting state until the temperature becomes stable. Then, the first process gas containing DCS gas, the second process gas containing $NH_3$ gas, and the assist gas consisting of $N_2$ gas are intermittently supplied from the respective gas distribution nozzles 36, 34, and 38 at controlled flow rates.

Specifically, the first process gas containing DCS gas is supplied from the gas spouting holes 36A of the gas distribution nozzle 36 to form gas flows parallel with the wafers W on the wafer boat 12. While being supplied, molecules of DCS gas and molecules and atoms of decomposition products generated by its decomposition are adsorbed on the wafers W.

On the other hand, the second process gas containing $NH_3$ gas is supplied from the gas spouting holes 34A of the gas distribution nozzle 34 to form horizontal gas flows toward the opening 54. The second process gas is selectively excited and partly turned into plasma when it passes through the plasma generation area PS between the pair of electrodes 58. At this time, for example, radicals (activated species), such as N*, NH*, $NH_2$*, and $NH_3$*, are produced (the symbol [*] denotes that it is a radical). The radicals flow out from the opening 54 of the gas exciting section 50 toward the center of the process container 4, and are supplied into gaps between the wafers W in a laminar flow state.

The radicals react with molecules of DCS gas adsorbed on the surface of the wafers W, so that a silicon nitride film is formed on the wafers W. Alternatively, when DCS gas flows onto radicals adsorbed on the surface of the wafers W, the same reaction is caused, so a silicon nitride film is formed on the wafers W.

Immediately after the step of supplying the first process gas containing DCS gas, and immediately after the step of supplying the second process gas containing $NH_3$ gas, the assist gas consisting of $N_2$ gas is supplied as a purge gas into the process field 5. The assist gas is supplied from the gas spouting holes 38A of the gas distribution nozzle 38 to form gas flows parallel with the wafers W on the wafer boat 12. The assist gas flows thus formed serve to forcibly remove residual components within the process field 5, such as DCS gas and its decomposition products or $NH_3$ gas and its decomposition products.

Specifically, the film formation method according to this embodiment is arranged to alternately repeat first to fourth steps T1 to T4. A cycle comprising the first to fourth steps T1 to T4 is repeated a number of times, and thin films of silicon nitride formed by respective cycles are laminated, thereby arriving at a silicon nitride film having a target thickness.

The first step T1 is arranged to perform supply of the first process gas (containing DCS) to the process field 5, while stopping supply of the second process gas (containing $NH_3$) and the assist gas ($N_2$) to the process field 5. The second step T2 is arranged to perform supply of the assist gas to the process field 5, while stopping supply of the first and second process gases to the process field 5. The third step T3 is arranged to perform supply of the second process gas to the process field 5, while stopping supply of the first process gas and assist gas to the process field 5. Further, halfway through the third step T3, the RF power supply 60 is set in the ON state to turn the second process gas into plasma by the gas exciting section 50, so as to supply the second process gas in an activated state to the process field 5 during a sub-step T3b. The fourth step T4 is arranged to perform supply of the assist gas to the process field 5, while stopping supply of the first and second process gases to the process field 5. Over the entirety of the first step T1 to the fourth step T4, the process field 5 is continuously vacuum-exhausted by the vacuum exhaust system GE through the exhaust passage 84.

After the film formation process is finished, the assist gas consisting of $N_2$ gas is supplied at a predetermined flow rate from the gas distribution nozzle 38 into the process container 4, so that the pressure inside the process container 4 is returned to atmospheric pressure. Then, the lid 18 is moved down by the elevating mechanism 25, and the wafer boat 12 is thereby unloaded along with the wafers W from the process container 4.

Figure 4:
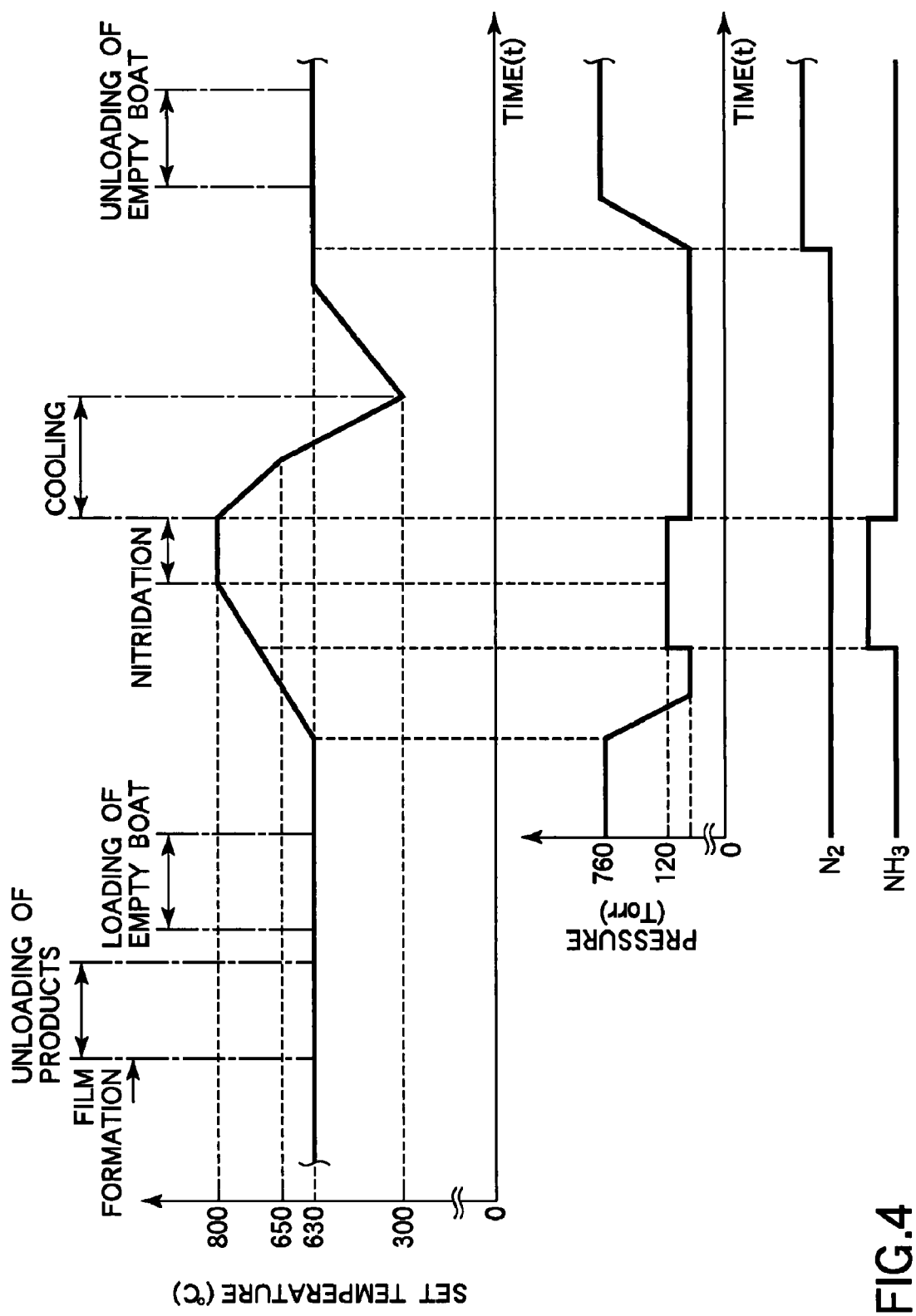
FIG. 4 is a timing chart showing the recipe of a post process for removing by-product films according to this embodiment.
Figure 5:
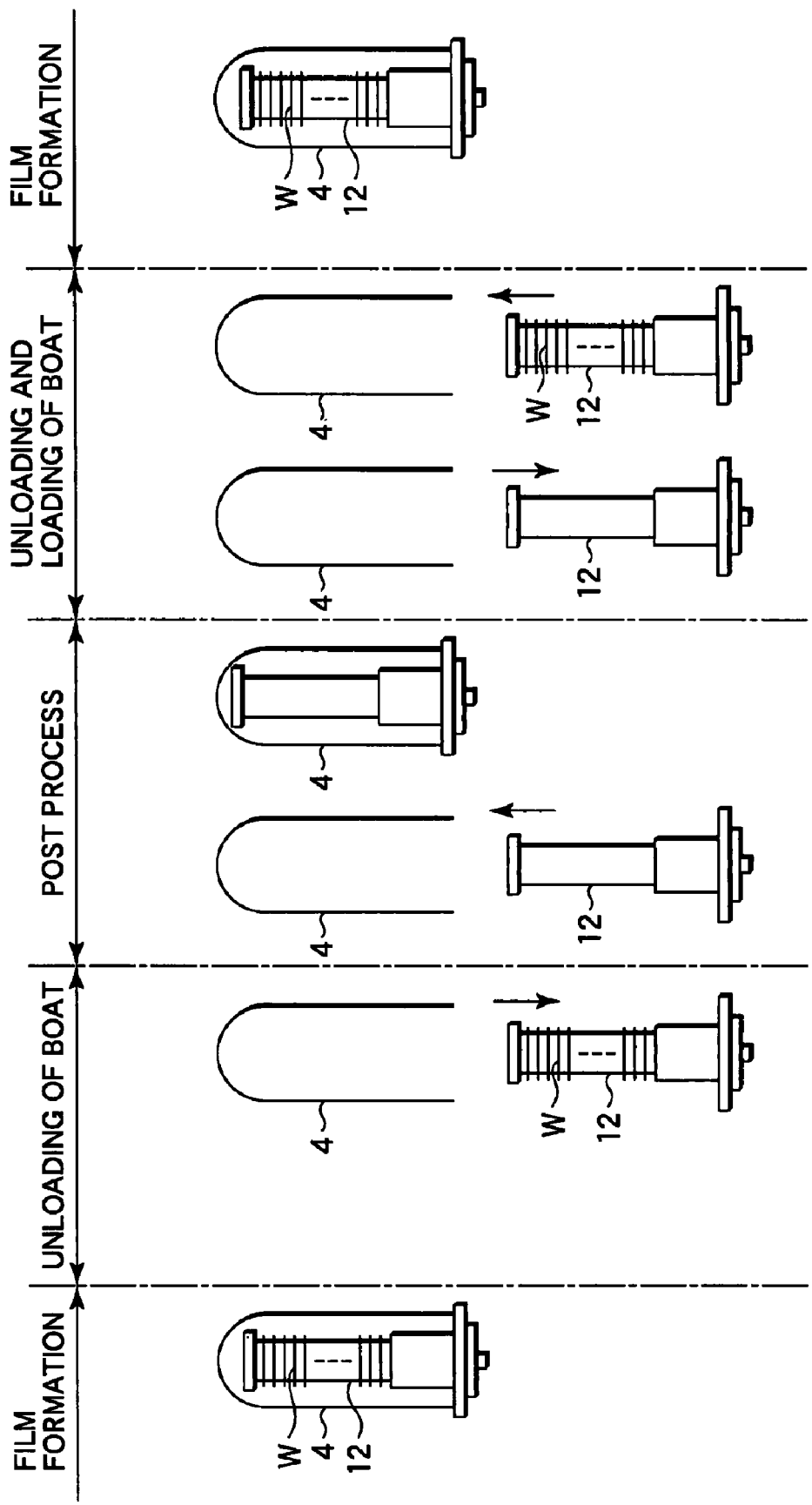
FIG. 5 is a view showing the relationship between the process container, wafer boat, and wafers during the film formation process and post process, in the apparatus shown in FIG. 1.

When the film formation process is performed, silicon nitride produced by the film formation reaction is deposited (adhered) not only on the surface of wafers W, but also on the inner surface of the process container 4 and so forth, as by-product films. Accordingly, a post process for removing the by-product films is performed subsequently to the film formation process. This post process may be performed every time the film formation process is performed or after the film formation process is repeated a predetermined number of times. FIG. 4 is a timing chart showing the recipe of the post process for removing by-product films according to this embodiment. FIG. 5 is a view showing the relationship between the process container, wafer boat, and wafers during the film formation process and post process.

Where the post process is performed after the wafers W are unloaded, the wafer boat 12 used in the former process is set in an empty state with no wafers W supported thereon and is loaded into the process container 4. However, the following process may be performed without an empty wafer boat 12 loaded in the process container 4. In such a case, the port of the process container 4 (i.e., the bottom port of the manifold 8) is closed by a shutter disposed near the port in a well-known manner.

Then, the interior of the process container 4 is vacuum-exhausted by the vacuum pump 88 at 400 Pa (3 Torr)/sec to set the pressure inside the process container 4 at a predetermined vacuum level, such as 1.33 Pa (0.01 Torr). Along with the start of vacuum-exhausting, the temperature inside the process container 4 is increased from the film formation temperature 400 to 650° C., such as 630° C., to a higher post process temperature 600 to 850° C., such as 800° C. After the pressure inside the process container 4 reaches a predetermined vacuum level and while the set temperature inside the process container 4 is being increased, the second process gas containing $NH_3$ gas is supplied at a predetermined flow rate from the gas supply source 73 through the gas distribution nozzle 34 into the process container 4. At this time, for example, the partial pressure of $NH_3$ gas is set to be 8,000 to 40,000 Pa (60 to 300 Torr), such as 16,000 Pa (120 Torr), at the post process temperature (800° C.). This state is kept for a predetermined time of, e.g., 50 minutes to perform the post process.

As described above, by-product films containing silicon nitride as the main component are formed by the film formation process inside the process container 4, such as the inner surface of the process container 4 and the wafer boat 12. Since the film formation process temperature is relatively low, e.g., about 630° C., by-product films deposited on the inner surface in areas where ammonia radicals are substantially deactivated, such as a position near the exhaust port 88 of the process container, are silicon rich films having a lower content of nitrogen and a higher content of silicon. The post process is arranged to cause these by-product films to react with $NH_3$ gas set at a high partial pressure and at a higher temperature than that of the film formation process, thereby promoting nitridation of the by-product films (nitridation step).

Then, for example, air set at room temperature or higher is supplied into the casing 70 from the cooling gas supply source 75 through the gas supply port 74, and is exhausted from the exhaust passage 7. With this operation, the process container 4 is rapidly cooled from outside, so that the temperature inside the process container 4 is quickly decreased from the post process temperature to a predetermined temperature of less than 400° C., such as 300° C., at a cooling rate of 10 to 25° C./min, such as 20° C./min (rapid cooling step). At this time, the interior of the process container 4 is vacuum-exhausted by the vacuum pump 88 to a predetermined vacuum level of, e.g., 1.33 Pa (0.01 Torr).

When the interior of the process container 4 is rapidly cooled, the by-product films thus nitrided on the inner surface of the process container 4 and the wafer boat 12 is partly cracked and peeled off from the inner surface of the process container 4 by a thermal stress (due to the difference in thermal contraction between the silicon nitride films and the process container 4 made of quartz). The particles of by-product films peeled off from the inner surface of the process container 4 are carried by the gas flow of the second process gas containing $NH_3$ gas or $NH_3$ gas and $N_2$ gas, and are exhausted from inside the process container 4 (exhaust step).

During the rapid cooling step, the interior of the process container 4 is forcibly exhausted by the vacuum pump 88 and the gas flow described above is thereby formed. Accordingly, the exhaust step proceeds, overlapping with the rapid cooling step.

Thereafter, the set temperature inside the process container 4 is increased from 300° C. to, e.g., 630° C. Then, the assist gas consisting of $N_2$ gas is supplied at a predetermined flow rate into the process container 4 from the assist gas supply circuit 32 through the gas distribution nozzle 38, so that the pressure inside the process container 4 is returned to atmospheric pressure. Then, the empty wafer boat 12 with no wafers W supported thereon is unloaded from the process container 4. Then, product wafers W to be subjected to the film formation process are transferred onto this wafer boat 12 within the loading area (not shown), and the film formation process is subsequently performed in the manner described above.

According to the embodiment described above, after the film formation process of a silicon nitride film, the temperature inside the process container 4 is increased from the film formation temperature to the post process temperature. Further, $NH_3$ gas is supplied into the process container 4 to have a very high partial pressure of, e.g., 16,000 Pa (120 Torr). With this post process, by-product films are further nitrided, and the difference in thermal contraction between the by-product films and the process container 4 made of quartz is thereby increased. Consequently, when the interior of the process container 4 is rapidly cooled thereafter, a large thermal stress acts on the by-product films deposited inside the process container 4. This makes it possible to reliably peel off surface portions of the films deposited inside the process container in a sate where they can easily become particles.

In the film formation process utilizing plasma to activate $NH_3$ gas as described above, nitridation becomes insufficient in areas of the process container 4 where the activation level of $NH_3$ gas is low. In such areas, by-product films are formed as films that can be hardly peeled off only by rapid cooling. However, the post process is arranged to further nitride the by-product films, so the films can be easily peeled off by rapid cooling. Consequently, the film formation process can be performed thereafter while suppressing gas generation and particle contamination due to by-product films deposited on the inner surface of the process container 4 and the wafer boat 12.

In the embodiment described above, the second process gas containing $NH_3$ gas is activated, but the first process gas containing DCS gas may be also activated. Specifically, a step of adsorbing radicals of DCS gas onto the surface of wafers W and a step of adsorbing radicals of $NH_3$ gas onto the surface of the wafers W may be alternately performed. Alternatively, the first and second process gases both in an activated state may be supplied at the same time into the process container 4 at predetermined flow rates to form a silicon nitride film on the surface of wafers W. This method can be realized by disposing the gas distribution nozzle 36 of the first process gas supply circuit 30 within the gas exciting section 50.

The present invention may be applied to a thermal CVD process to form a silicon nitride film on the surface of wafers W. In a thermal CVD process, the first process gas containing DCS gas and the second process gas containing $NH_3$ gas both in a non-activated state may be alternately supplied a plurality of times into the process container 4 set at a predetermined temperature. In another thermal CVD process, the first and second process gases may be supplied into the process container 4 at the same time.

In the embodiment described above, the first process gas contains DCS gas as a silane family gas. In this respect, the silane family gas may be one or more gases selected from the group consisting of dichlorosilane (DCS), hexachlorodisilane (HCD), monosilane ($SiH_4$), disilane ($Si_2Cl_6$), hexamethyl-disilazane (HMDS), tetrachlorosilane (TCS), disilylamine (DSA), trisilylamine (TSA), and bistertialbutylaminosilane (BTBAS).

In the embodiment described above, the second process gas contains ammonia ($NH_3$) gas as a nitriding gas. In this respect, the nitriding gas may be selected from nitrogen oxide gases, such as $N_2O$, NO, and NO2, other than ammonia ($NH_3$). Where a nitrogen oxide gas is used, a film formed by the film formation process becomes a silicon nitride film or a silicon nitride film containing oxygen (silicon oxynitride film), depending on the process conditions. Where a nitrogen oxide gas is used in the film formation process, the same nitrogen oxide gas may be used as a nitriding gas in the post process in place of ammonia gas.

In the embodiment described above, the process container 4 and wafer boat 12 are exemplified by quartz members. In this respect, these members may be made of silicon carbide.

EXPERIMENT

First Present Example PE1

Using the film formation apparatus shown in FIGS. 1 and 2, a film formation process of a silicon nitride film was performed on wafers W supported by the wafer boat 12. After the wafer boat 12 with the wafers W supported thereon was unloaded, the sequence shown in FIG. 4 was executed in the same apparatus to perform a post process for the interior of the process container 4 subsequently to the film formation process. Then, a wafer boat 12 with new wafers W supported thereon was loaded into the apparatus, and the same film formation process was performed. In the film formation process, the temperature inside the process container 4 was set at 630° C., and DCS gas and ammonia gas were used as film formation gases. In the post process, the temperature inside the process container 4 was set at 800° C., and ammonia gas was used as a post process gas. The partial pressure of ammonia was set at 1,200 Pa (10 Torr) at the post process temperature. After the post process, the set temperature inside the process container 4 was quickly decreased from 800° C. to 300° C., while the interior of the process container 4 was vacuum-exhausted.

Second Present Example PE2

The film formation process, post process, and film formation process were performed under the same process conditions as those of the first present example PE1 except that the partial pressure of ammonia was set at 8,000 Pa (60 Torr) in the post process.

Third Present Example PE3

The film formation process, post process, and film formation process were performed under the same process conditions as those of the first present example PE1 except that the partial pressure of ammonia was set at 16,000 Pa (120 Torr) in the post process.

Comparative Example CE

The film formation process, post process, and film formation process were performed under the same process conditions as those of the second present example PE2 except that N₂ gas was used as the post process gas.

(Observation)

In each of the present examples and comparative example, after the second film formation process was performed, particles of 0.065 μm or more deposited on the surface of samples of unloaded wafers W were observed while the surface was irradiated with light. As sample wafers W, three wafers were selected respectively from the top (TOP), center (CTR), and bottom (BTM) of the wafer boat 12, (Result and Examination)

Figure 6:
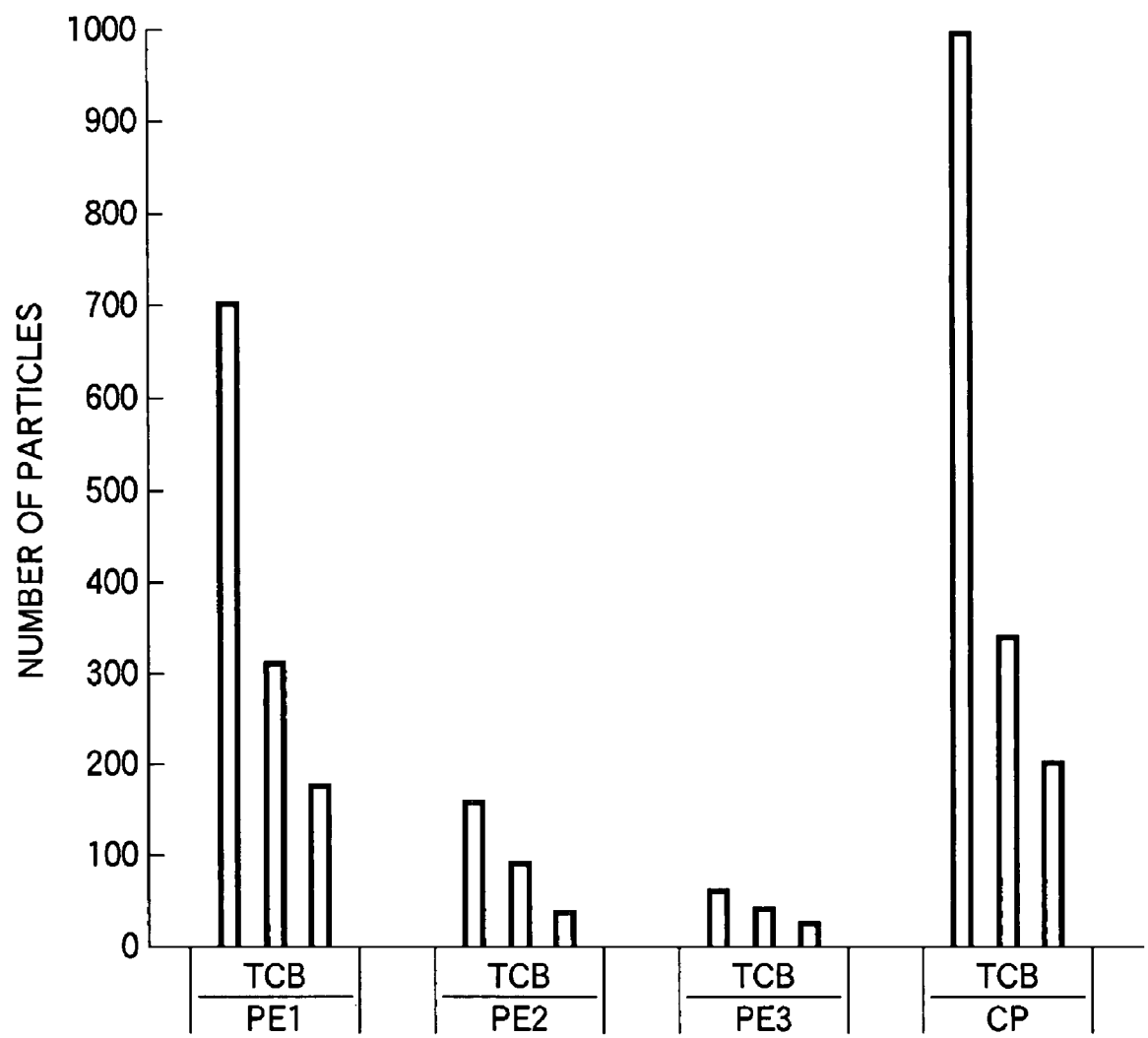
FIG. 6 is a graph showing a result of an experiment concerning the number of particles in present examples and a comparative example.

FIG. 6 is a graph showing a result of this experiment concerning the number of particles in the present examples and comparative example. As shown in FIG. 6, the first to third present examples PE1 to PE3 rendered a far smaller number of particles deposited on the surface of wafers (TOP, CTR, BTM), as compared to the comparative example. From this result, it has been confirmed that $NH_3$ gas is more effective than $N_2$ gas, as a post process gas supplied into the process container 4.

The second and third present examples PE2 and PE3 rendered a far smaller number of particles deposited on the surface of wafers (TOP, CTR, BTM), as compared to the first present example PE1. From this result, it has been confirmed that the partial pressure of ammonia gas within the process container 4 is preferably set to be 8,000 Pa or more in the post process. In this respect, it seems that no disadvantage is brought about in obtaining the effect of the present invention described above, even where the partial pressure of $NH_3$ gas in the post process is very high (i.e., there is no specific upper limit).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for using a film formation apparatus, the apparatus comprising:
   a reaction chamber consisting essentially of quartz and having a vertically elongated process field that accommodates a plurality of target substrates;
   a holder that supports the target substrates at intervals in a vertical direction inside the process field;
   a transfer mechanism that loads and unloads the target substrates along with the holder to and from the reaction chamber,
   an exciting mechanism attached on a sidewall of the reaction chamber and including a plasma generation area communicating with the process field and extending over a vertical length corresponding to the process field;
   a process gas supply system that selectively supplies a silicon-containing gas and ammonia gas into the process field, such that the silicon-containing gas is supplied into the process field not through the plasma generation area and the ammonia gas is supplied into the process field through the plasma generation area, and the silicon-containing gas and the ammonia gas are supplied to form essentially horizontal gas flows in the process field over a length corresponding to the process field in a vertical direction;
   an exhaust system that exhausts gas from inside the reaction chamber through an exhaust passage connected to the reaction chamber;
   a casing surrounding the reaction chamber;
   a heater disposed inside the casing that heats the reaction chamber from outside;
   a cooling gas supply circuit that supplies a cooling gas from below into the casing to cool the reaction chamber from outside by the cooling gas; and
   a cooling gas exhaust passage connected to a top of the casing, the method comprising:
   performing a plasma-assisted CVD process of forming a product film consisting of a silicon nitride film on the target substrates supported on the holder within the process field, the plasma-assisted CVD process being performed by supplying the silicon-containing gas and the ammonia gas into the process field while generating plasma of the ammonia gas by the exciting mechanism and setting the process field at a film formation temperature of 250 to 700° C.;
   then unloading the target substrates along with the holder from the reaction chamber; and
   then, performing a post process with no target substrates present inside the reaction chamber;
   wherein the post process comprises
   performing nitridation of nitriding by-product films, generated by the plasma-assisted CVD and deposited on the inner surface of the reaction chamber, the nitridation being performed while maintaining a constant post process pressure and a constant post process temperature in the reaction chamber for a predetermined time period, the post process pressure being set by supplying the ammonia gas as a post process gas by into the reaction chamber from the process gas supply system and exhausting gas from the reaction chamber by the exhaust system to have a partial pressure of the ammonia gas at 8,000 to 40,000 Pa inside the reaction chamber, and the post process temperature being set by heating the inner surface of the reaction chamber by the heater at a temperature of 600 to 850° C. and higher than the film formation temperature;
   then, cooling, from outside by the cooling gas, the inner surface of the reaction chamber from the post process temperature to a lower temperature at less than 400° C. at a cooling rate of 10 to 25° C./minute, thereby cracking the nitrided by-product films by thermal stress and peeling off the by-product films from the inner surface; and
   forcibly exhausting gas from inside the reaction chamber by the exhaust system to carry the by-product films thus peeled off from the inner surface, by a gas flow, thereby removing the by-product films.

2. The method according to claim 1, wherein the gas flow is formed by the ammonia gas used as the post process gas.

3. The method according to claim 1, wherein the holder consists essentially of quartz, and the post process further comprises loading the holder with no target substrates supported thereon into the reaction chamber before the nitridation.

4. The method according to claim 1, wherein the film formation temperature is set to be 400 to 650° C.

5. A film formation apparatus for forming a silicon nitride film on a plurality of target substrates, the apparatus comprising:
   a reaction chamber consisting essentially of quartz and having a vertically elongated process field that accommodates the target substrates;
   a holder that supports the target substrates at intervals in a vertical direction inside the process field;
   a transfer mechanism that loads and unloads the target substrates to and from the reaction chamber;

an exciting mechanism attached on a sidewall of the reaction chamber and including a plasma generation area communicating with the process field and extending over a vertical length corresponding to the process field;

a process gas supply system that selectively supplies a silicon-containing gas and ammonia gas into the process field, such that the silicon-containing gas is supplied into the process field not through the plasma generation area and the ammonia gas is supplied into the process field through the plasma generation area, and the silicon-containing gas and the ammonia gas are supplied to form essentially horizontal gas flows in the process field over a length corresponding to the process field in a vertical direction;

an exhaust system to exhaust gas from inside the reaction chamber through an exhaust passage connected to the reaction chamber;

a casing surrounding the reaction chamber;

a heater disposed inside the casing to heat the reaction chamber from the outside;

a cooling gas supply circuit that supplies a cooling gas from below into the casing to cool the reaction chamber from outside by the cooling gas;

a cooling gas exhaust passage connected to a top of the casing; and a control section that controls operation of the apparatus and includes a computer readable non-transitory storage medium that stores program instructions for execution on a processor, wherein the program instructions, when executed by the processor, cause the film formation apparatus to conduct a method for using the film formation apparatus, the method, comprising:

performing a plasma-assisted CVD process of forming a product film consisting of a silicon nitride film on the target substrates supported on the holder within the process field, the plasma-assisted CVD process being performed by supplying the silicon-containing gas and the ammonia gas into the process field while generating plasma of the ammonia gas by the exciting mechanism and setting the process field at a film formation temperature of 250 to 700° C., then, unloading the target substrates along with the holder from the reaction chamber, and then, performing a post process with no target substrates present inside the reaction chamber, wherein the post process comprises:

performing nitridation of nitriding by-product films generated by the plasma-assisted CVD and deposited on an inner surface of the reaction chamber, the nitridation being performed while maintaining a constant post process pressure and a constant post process temperature in the reaction chamber for a predetermined time period, the post process pressure being set by supplying the ammonia gas as a post process gas into the reaction chamber from the process gas supply system and exhausting gas from the reaction chamber by the exhaust system to have a partial pressure of the ammonia gas at 8,000 to 40,000 Pa inside the reaction chamber and and the post process temperature being set by heating the inner surface of the reaction chamber by the heater at a temperature of 600 to 850° C. and higher than the film formation temperature;

then, cooling, from outside by the cooling gas, the inner surface of the reaction chamber from the post process temperature to a lower temperature at less than 400° C. at a cooling rate of 10 to 25° C./minute, thereby cracking the nitrided by-product films by a thermal stress and peeling off the by-product films from the inner surface, and forcibly exhausting gas from inside the reaction chamber by the exhaust system to carry the by-product films thus peeled off from the inner surface, by a gas flow, thereby removing the by-product films.

6. A computer readable non-transitory storage medium containing program instructions for execution on a processor, wherein the program instructions, when executed by the processor, cause a film formation apparatus to execute a method for using the film formation apparatus, the apparatus comprising:

a reaction chamber consisting essentially of quartz and having a vertically elongated process field that accommodates a plurality of target substrates;

a holder that supports the target substrates at intervals in a vertical direction inside the process field;

a transfer mechanism that loads and unloads the target substrates along with the holder to and from the reaction chamber, an exciting mechanism attached on a sidewall of the reaction chamber and including a plasma generation area communicating with the process field and extending over a vertical length corresponding to the process field;

a process gas supply system that selectively supplies a silicon-containing gas and ammonia gas into the process field, such that the silicon-containing gas is supplied into the process field not through the plasma generation area and the ammonia gas is supplied into the process field through the plasma generation area, and the silicon-containing gas and the ammonia gas are supplied to form essentially horizontal gas flows in the process field over a length corresponding to the process field in a vertical direction;

an exhaust system that exhausts gas from inside the reaction chamber through an exhaust passage connected to the reaction chamber;

a casing surrounding the reaction chamber;

a heater disposed inside the casing to heat the reaction chamber from outside;

a cooling gas supply circuit that supplies a cooling gas from below into the casing to cool the reaction chamber from outside by the cooling gas; and a cooling gas exhaust passage connected to a top of the casing, the method comprising:

performing a plasma-assisted CVD process of forming a product film consisting of a silicon nitride film on the target substrates supported on the holder within the process field, the plasma-assisted CVD process being performed by supplying the silicon-containing gas and the ammonia gas into the process field while generating plasma of the ammonia gas by the exciting mechanism and setting the process field at a film formation temperature of 250 to 700° C., then, unloading the target substrates along with the holder from the reaction chamber, and then, performing a post process with no target substrates present inside the reaction chamber, wherein the post process comprises:

performing nitridation of nitriding by-product films generated by the plasma-assisted CVD and deposited on an inner surface of the reaction chamber, the nitridation being performed while maintaining a constant post process pressure and a constant post process temperature in the reaction chamber for a predetermined time period, the post process pressure being set by supplying the ammonia gas as a post process gas by into the reaction chamber from the process gas supply system and exhausting gas from the reaction chamber by the exhaust system to set have a partial pressure of the ammonia gas at 8,000 to 40,000 Pa inside the reaction chamber and the post process temperature being set by heating the inner surface of the reaction chamber by the heater at a temperature of 600 to 850° C. and higher than the film formation temperature;

then, cooling, from outside by the cooling gas, the inner surface of the reaction chamber from the post process temperature to a lower temperature at less than 400° C. at a cooling rate of 10 to 25° C./minute, thereby cracking the nitrided by-product films by a thermal stress and peeling off the by-product films from the inner surface, and forcibly exhausting gas from inside the reaction chamber by the exhaust system to carry the by-product films thus peeled off from the inner surface, by a gas flow, thereby removing the by-product films.

7. The method according to claim 1, wherein the process field is set at a film formation pressure of 27 to 133 Pa in the plasma-assisted CVD process.

8. The method according to claim 1, wherein said cooling the inner surface of the reaction chamber and said forcibly exhausting gas from inside the reaction chamber proceed, overlapping with each other.

9. The method according to claim 1, wherein the silane-containing gas is selected from the group consisting of dichlorosiliane, hexachlorodisilane, monosilane, disilane, hexamethyldisilizane, tetrachlorsilane, disilylamine, trisilylamine, and bistertialbutylaminosilane.

10. The method according to claim 1, wherein said forcibly exhausting gas from inside the reaction chamber comprises setting the reaction chamber at a pressure therein lower than that used in the nitridation of the post process.

11. The method according to claim 10, wherein said forcibly exhausting gas from inside the reaction chamber is performed without supplying ammonia gas into the reaction chamber.

12. The method according to claim 1, wherein, after said forcibly exhausting gas from inside the reaction chamber, the post process further comprises supplying nitrogen gas into the reaction chamber to return the reaction chamber to atmospheric pressure therein.

13. The method according to claim 1, wherein, after said cooling the inner surface of the reaction chamber, the post process further comprises heating the inner surface from the lower temperature to a higher temperature while forcibly exhausting gas from inside the reaction chamber.

14. The method according to claim 1, wherein the cooling gas is air set at room temperature or higher.

\* \* \* \* \*